(12) United States Patent
Meguro et al.

(10) Patent No.: US 6,876,565 B2
(45) Date of Patent: Apr. 5, 2005

(54) SEMICONDUCTOR MEMORY DEVICE (75) Inventors: Hisataka Meguro, Kanagawa (JP); Shigeki Sugimoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 18 days.

(21) Appl. No.: 10/671,655

(22) Filed: Sep. 29, 2003

(65) Prior Publication Data
US 2004/0140569 A1 Jul. 22, 2004

(30) Foreign Application Priority Data
Sep. 30, 2002 (JP) ........................................ 2002-287220

(51) Int. Cl.$^7$ ................................................ G11C 5/06
(52) U.S. Cl. ............................. 365/72; 365/51; 365/63
(58) Field of Search ............................... 365/72, 63, 51, 365/102; 438/633, 634

(56) References Cited

U.S. PATENT DOCUMENTS

| | | | |
|---|---|---|---|
| 5,356,834 A | | 10/1994 | Sugimoto et al. |
| 5,994,218 A | | 11/1999 | Sugimoto et al. |
| 6,133,144 A | * | 10/2000 | Tsai et al. .................. 438/634 |
| 6,429,119 B1 | * | 8/2002 | Chao et al. ................. 438/633 |

FOREIGN PATENT DOCUMENTS

JP  2002-57227  2/2002

OTHER PUBLICATIONS

Shirota, R. et al., "Nonvolatile Semiconductor Memory Device and Method of Manufacturing the Same", Serial No. 09/470,518, filed Dec. 22, 1999, (abandoned Jun. 6, 2003).

* cited by examiner

*Primary Examiner*—Michael S. Lebentritt
*Assistant Examiner*—Hien Nguyen
(74) *Attorney, Agent, or Firm*—Finnegan, Henderson, Farabow, Garrett & Dunner, L.L.P.

(57) ABSTRACT

There are provided a plurality of first connection lines arranged in parallel with each other in a same layer, each connecting to a different contact portion; a plurality of second connection lines arranged in parallel with each other in the same layer as the first connection lines, the first connection lines and the second connection lines being arranged in an alternating fashion, and each of the second connection lines connecting to a different contact portion; a plurality of first metal wiring lines connecting to the first connection lines via first plugs; and a plurality of second metal wiring lines formed in a layer different from that of the first metal wiring lines, and connecting to the second connection lines via second plugs, the first metal wiring lines and the second metal wiring lines differing from each other with respect to at least one of thickness and width, or with respect to resistivity of wiring materials, and a product of a wiring capacitance between adjacent two of the first metal wiring lines and a wiring resistance of the first metal wiring lines being substantially the same as a product of those of the second metal wiring lines.

20 Claims, 13 Drawing Sheets

B-B SECTION

SEMICONDUCTOR MEMORY DEVICE

CROSS-REFERENCE TO RELATED APPLICATIONS

This application is based upon and claims the benefit of priority from the prior Japanese Patent Application No. 2002-287220, filed on Sep. 30, 2002, the entire contents of which are incorporated herein by reference.

BACKGROUND OF THE INVENTION

1. Field of the Invention

The present invention relates to semiconductor memory devices, and in particular to a semiconductor memory device having a memory cell array structure containing minute memory cells and metal wiring.

2. Related Art

Figure 9A:
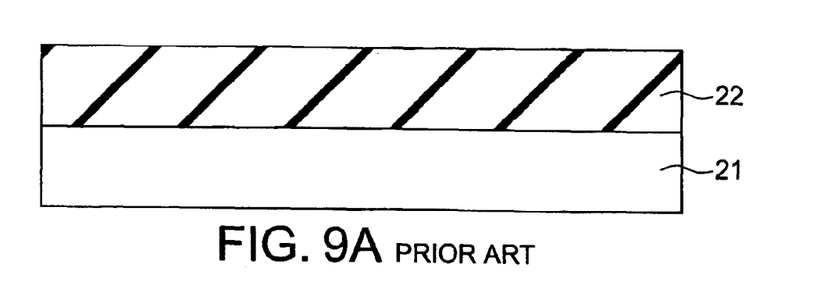
FIGS. 9A–9D are sectional views showing some steps of a process of manufacturing a conventional semiconductor memory device.
Figure 9B:
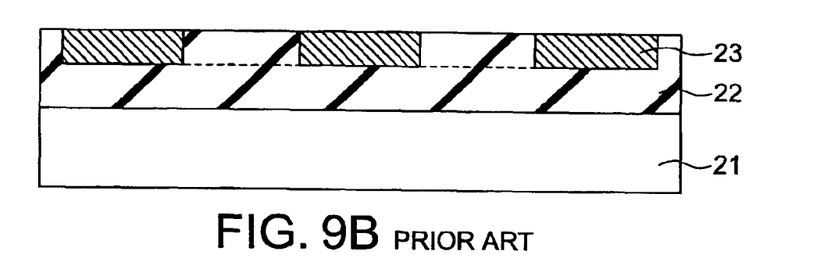

A process of forming wiring portions in a conventional semiconductor memory device will be described below with reference to FIGS. 9A to 11. FIGS. 9A to 10B are sectional views showing the steps of a process of forming a metal wiring portion of a memory cell. First, an interlayer dielectric film 22 having flat surface and having a thickness of 500 nm is formed on, for example, a main surface of a p-type silicon semiconductor substrate 21 (FIG. 9A). Next, a photoresist is applied to the entire surface of the interlayer dielectric film 22, and a desired resist pattern (not shown) is formed using the photolithography techniques. Thereafter, dry etching, e.g., RIE (Reactive Ion Etching), of the interlayer dielectric film 22 is performed to form grooves having a depth of, e.g., 100 nm in the interlayer dielectric film 22. Then, metal wiring having a laminated structure is formed, the laminated structure including, from lower to upper layers, a Ti layer having a thickness of 50 nm, a TiN layer having a thickness of 50 nm, and a W layer having a thickness of 250 nm. Subsequently, the surface thereof is flattened through CMP (Chemical Mechanical Polishing) to obtain a desired height, to form tungsten wiring 23 in the grooves (FIG. 9B). The tungsten wiring 23 connects to a diffusion layer in the substrate via contacts (not shown).

Figure 9C:
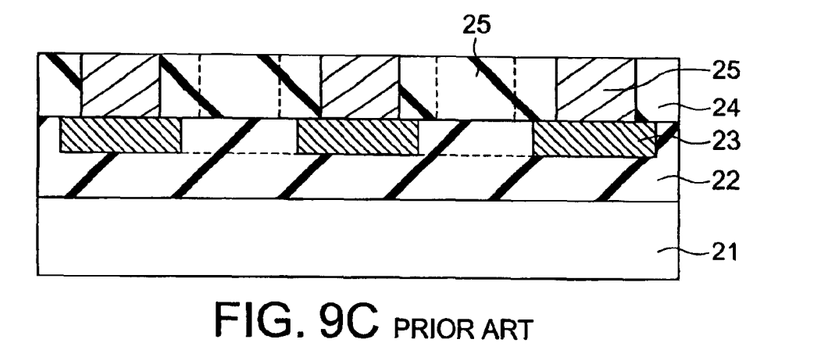

Next, an interlayer dielectric film 24 having a thickness of 500 nm is formed over the entire surface of the interlayer dielectric film 22 and the tungsten wiring 23. Then, a photoresist is applied to the entire surface of the interlayer dielectric film 24, a resist pattern (not shown) having openings above the part of the tungsten wiring 23 is formed using the photo lithography techniques, and the interlayer dielectric film 24 is patterned using the dry etching techniques, thereby forming via holes having a depth of 500 nm through the interlayer dielectric film 24, the via holes reaching the tungsten wiring 23. Thereafter, a metal layer having a laminated structure including, from lower to upper layers, a Ti layer having a thickness of 50 nm, a TiN layer having a thickness of 50 nm, and a W layer having a thickness of 250 nm is formed so as to fill in the via holes. Then, the surface of the metal layer is flattened through CMP (Chemical Mechanical Polishing) to obtain a desired height to form tungsten plugs 25 in the via holes (FIG. 9C).

Figure 9D:
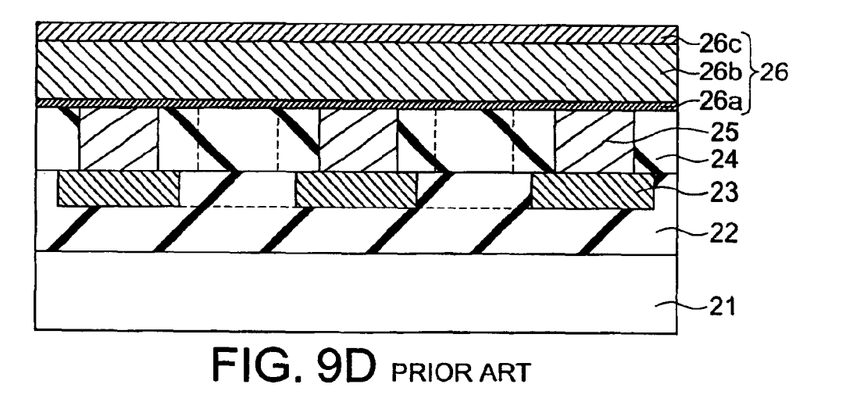

Then, a metal wiring layer 26 having a laminated structure including a barrier metal layer 26a having a Ti layer having a thickness of 50 nm and a TiN layer having a thickness of 50 nm, an Al layer 26b having a thickness of 200 nm, and a barrier metal layer 26c having a Ti layer having a thickness of 50 nm and a TiN layer having a thickness of 50 nm, is formed so as to cover the interlayer dielectric film 24 and the tungsten plug 25, the order of layers being from lower to upper (FIG. 9D).

Figure 10A:
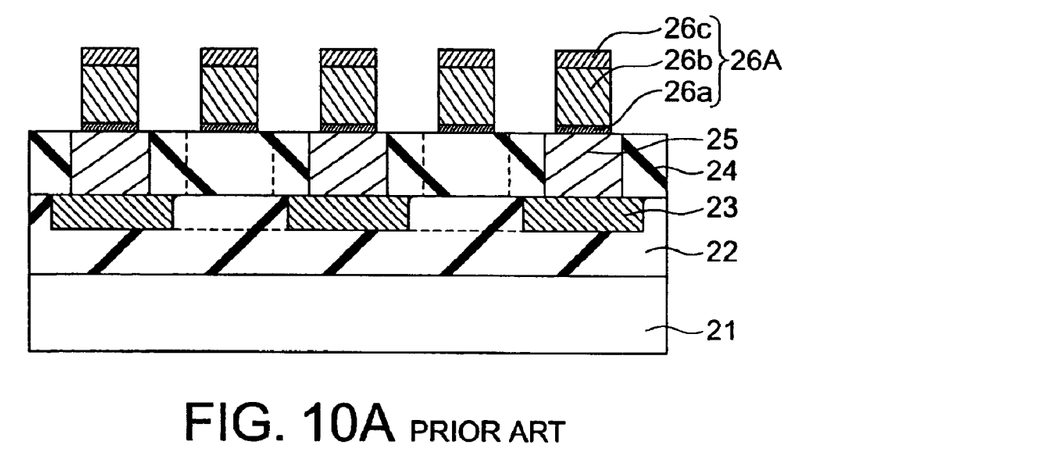
FIGS. 10A–10B are sectional views showing subsequent steps of the process of manufacturing the conventional semiconductor memory device.
Figure 10B:
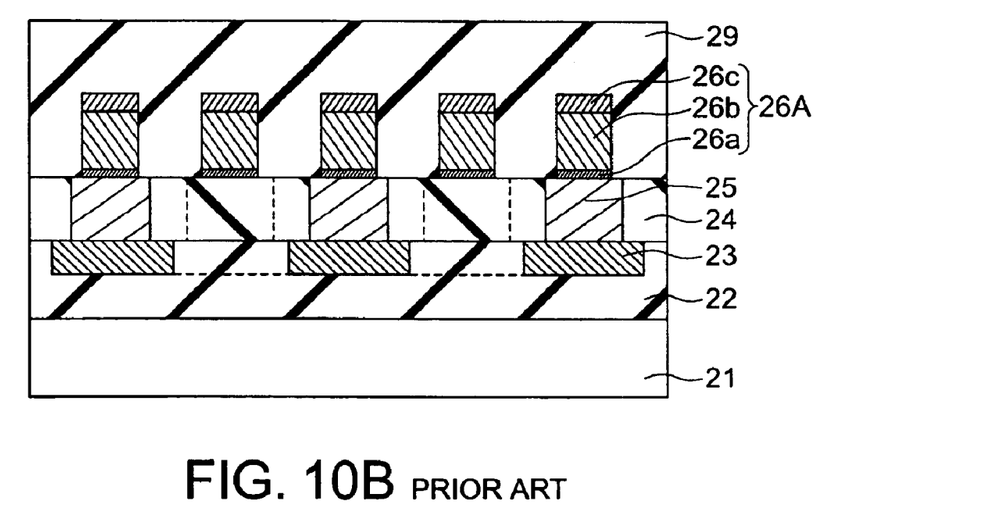
Figure 11:
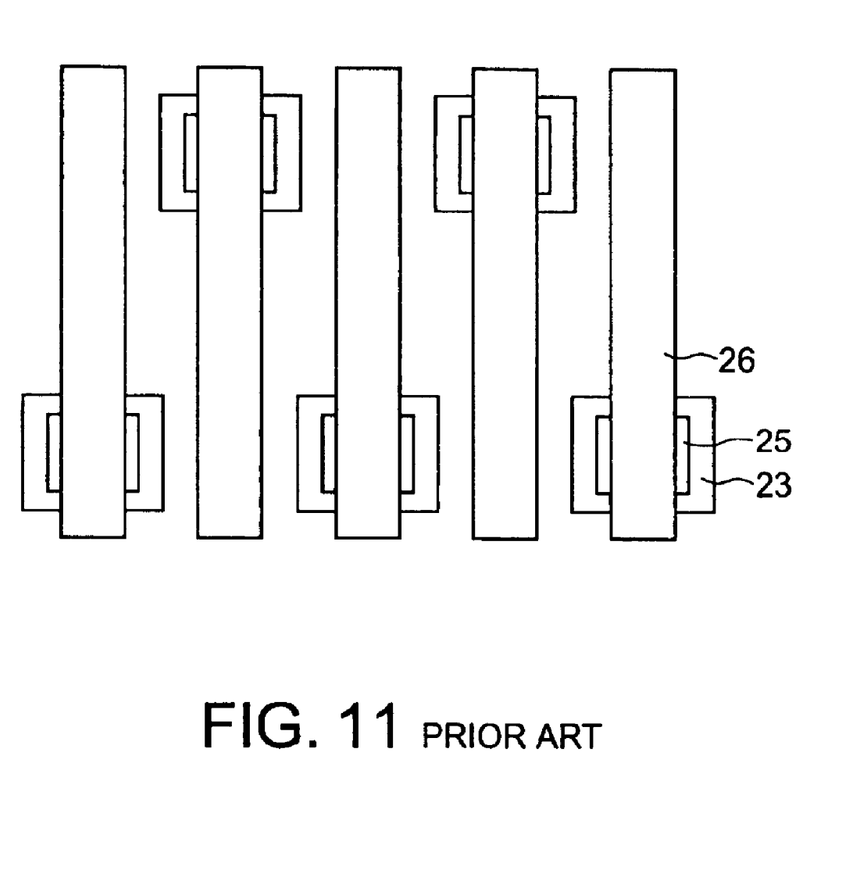
FIG. 11 is a plan view of metal the wiring of the conventional semiconductor memory device.

Subsequently, after a photoresist is applied to the metal wiring layer 26 and a desired resist pattern is formed using the photolithography techniques, the dry etching of the metal wiring layer 26 is performed, thereby forming metal wiring lines 26A at a desired position on the tungsten plugs 25 (FIG. 10A). Thereafter, a protection layer 29 is formed on the metal wiring lines 26A (FIG. 10B), thereby completing a part of the multi-layer wiring of the semiconductor memory device. FIG. 11 shows a plan view of the semiconductor memory device before the protection layer 29 is formed, i.e., the plan view of the semiconductor memory device shown in FIG. 10A omitting the interlayer dielectric film 24.

Figure 12:
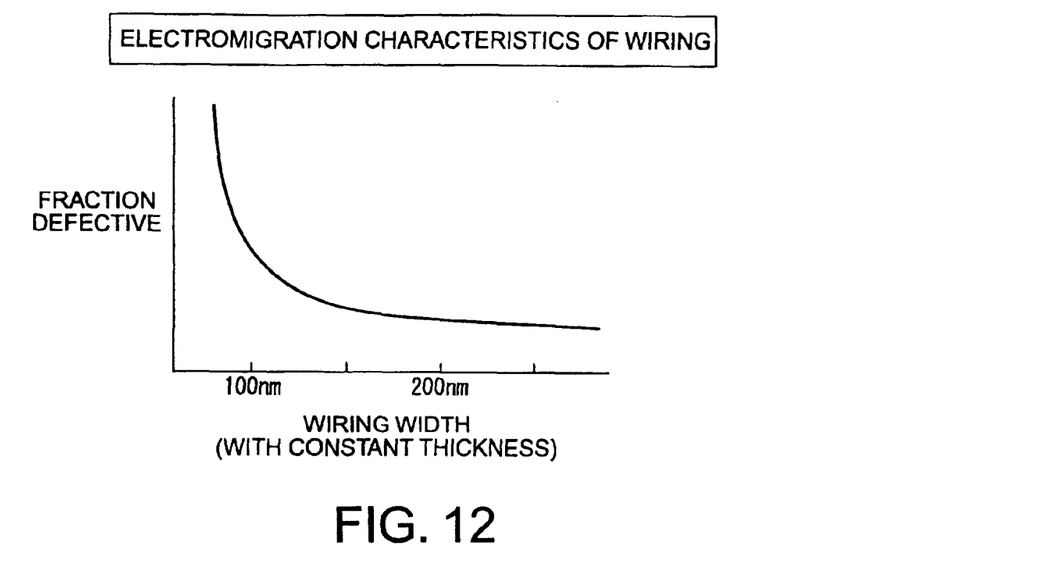
FIG. 12 is a graph showing the electromigration characteristic of wiring.

In the design of semiconductor memory device, the wiring, in particular the wiring used for word lines and bit lines, should be formed using a minimum design size. As the size of memory cells is decreased, the size of wiring should be decreased. However, as shown in FIG. 12, it is known that the electromigration (hereinafter referred to as "EM") characteristics, which show characteristics of metal wiring, are dependent on the wiring size, resulting in that in an area including finer wiring, the more the size of wiring is decreased, the more easily a failure occurs in the wiring. Therefore, there is a problem in that if memory cells are miniaturized to a great degree, it is likely that the reliability of metal wiring diminishes as well.

Figure 13:
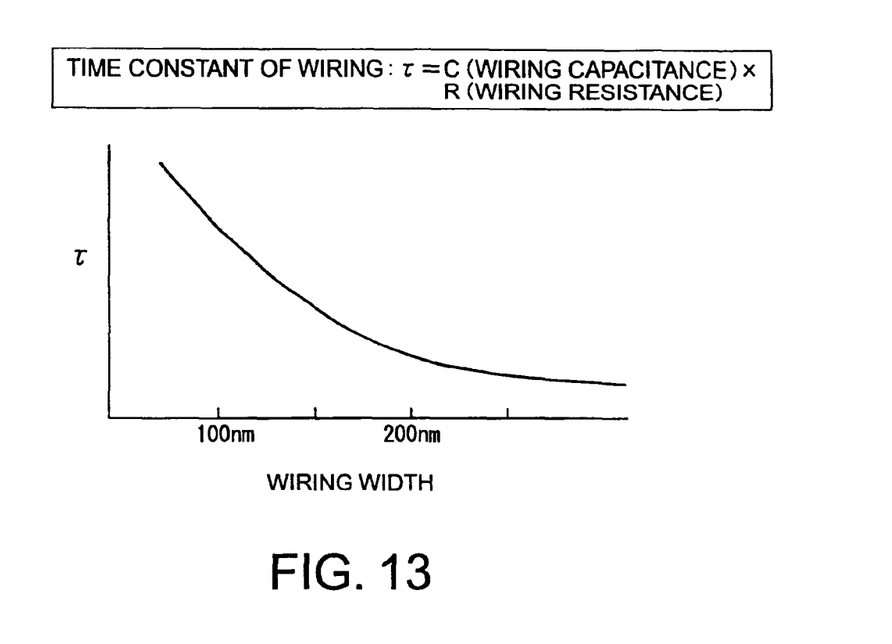
FIG. 13 is a graph showing the relationship between the wiring width and the time constant.

Another problem of the miniaturization is that, as shown in FIG. 13, the increase in the resistance R of the wiring and in the wiring capacitance C leads to an increase in the time constant $\tau(=C \times R)$, resulting in the delay of signals. Here, the wiring capacitance means the capacitance between adjacent wiring lines. Since a delay occurring in a signal line for transmitting signals causes changes in the driving of a transistor, which should operate at a high speed, the device performance may be affected.

A semiconductor memory device aiming to decrease the coupling capacitance between bit lines in order to decrease malfunctions is disclosed in Japanese Patent Laid-Open Publication No. 2002-57227. Each bit line of the semiconductor memory device has an upper wiring portion and a lower wiring portion, and the mutually adjacent portions of the respectively adjacent two bit lines are provided in different layers from each other.

SUMMARY OF THE INVENTION

A semiconductor memory device according to the first aspect of the present invention includes: a plurality of first connection lines arranged in parallel with each other in a same layer, each connecting to a different contact portion; a plurality of second connection lines arranged in parallel with each other in the same layer as the first connection lines, the first connection lines and the second connection lines being arranged in an alternating fashion, and each of the second connection lines connecting to a different contact portion; a plurality of first plugs each formed on one of the first connection lines; a plurality of second plugs each formed on one of the second connection lines; a plurality of first metal wiring lines connecting to the first plugs; and a plurality of second metal wiring lines formed in a layer different from that of the first metal wiring lines, and connecting to the second plugs, the first metal wiring lines and the second metal wiring lines differing from each other with respect to at least one of thickness and width, and a product of a wiring capacitance between adjacent two of the first metal wiring lines and a wiring resistance of the first metal wiring lines being substantially the same as a product of those of the second metal wiring lines.

A semiconductor memory device according to the second aspect of the present invention includes: a plurality of first connection lines arranged in parallel with each other in a same layer, each connecting to a different contact portion; a plurality of second connection lines arranged in parallel with each other in the same layer as the first connection lines, the first connection lines and the second connection lines being arranged in an alternating fashion, and each of the second connection lines connecting to a different contact portion; a plurality of first plugs each formed on one of the first connection lines; a plurality of second plugs each formed on one of the second connection lines; a plurality of first metal wiring lines connecting to the first plugs; and a plurality of second metal wiring lines formed in a layer different from that of the first metal wiring lines, and connecting to the second plugs, the first metal wiring lines and the second metal wiring lines differing from each other with respect to with respect to at least one of material and constitution, and a product of a wiring capacitance between adjacent two of the first metal wiring lines and a wiring resistance of the first metal wiring lines being substantially the same as a product of those of the second metal wiring lines.

DESCRIPTION OF THE EMBODIMENTS

Hereinafter, an embodiment of the present invention will be described with reference to the accompanying drawings.

Before a semiconductor memory device according to an embodiment of the present invention is described, a semiconductor memory device serving as a prototype of the embodiment will be described as a reference example with reference to FIGS. 1A–6. The semiconductor memory device of the reference example is obtained by the following steps.

Figure 1A:
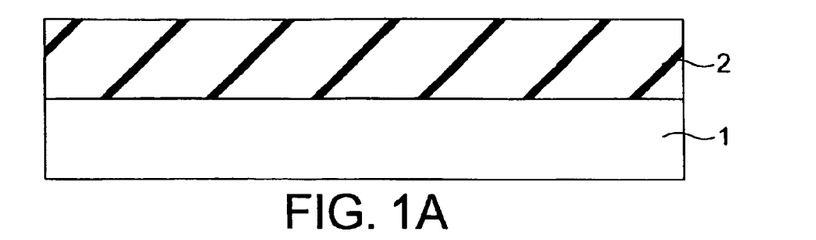
FIGS. 1A–1D are sectional views showing some steps of a process of manufacturing a semiconductor memory device serving as a reference example of an embodiment of the present invention.

First, for example, an interlayer dielectric film 2 having a flat surface and having a thickness of 500 nm is formed on a main surface of a p-type silicon semiconductor substrate 1, on which elements to become a memory cell array, a periphery circuit, etc. (not shown in the drawings) are formed (FIG. 1A). A gate line (not shown) is embedded in the interlayer dielectric film 2, and wiring lines extending perpendicular to the gate line are formed on the surface of the interlayer dielectric film 2. Specifically, a photoresist is applied to the entire surface of the interlayer dielectric film 2, and a desired resist pattern (not shown) is formed using the photolithography techniques. Thereafter, the dry etching of the interlayer dielectric film 2 is performed using the resist pattern as a mask, thereby forming grooves having a depth of 100 nm (not shown) in the interlayer dielectric film 2.

Figure 1B:
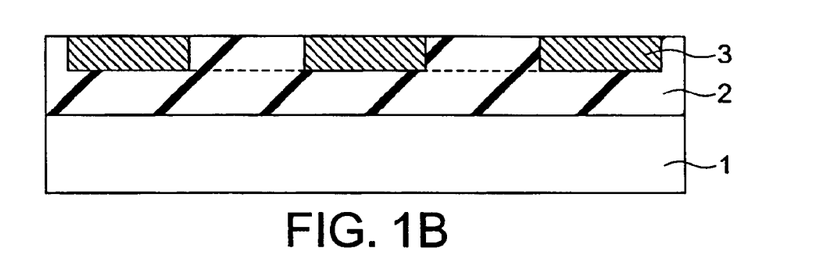
Figure 5:
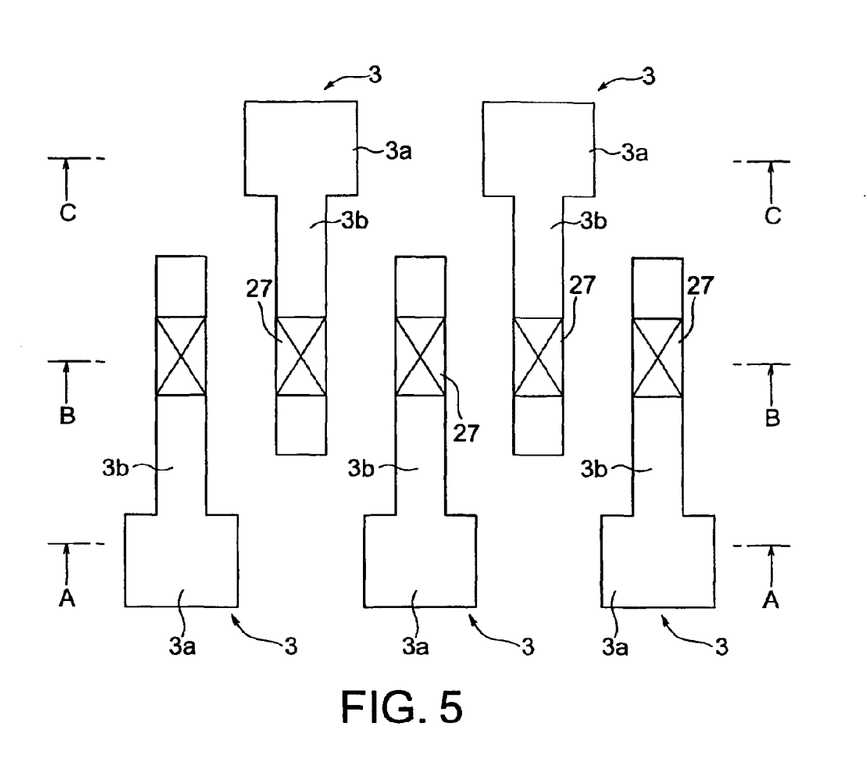
FIG. 5 is a plan view showing the structure of tungsten wiring.
Figure 6:
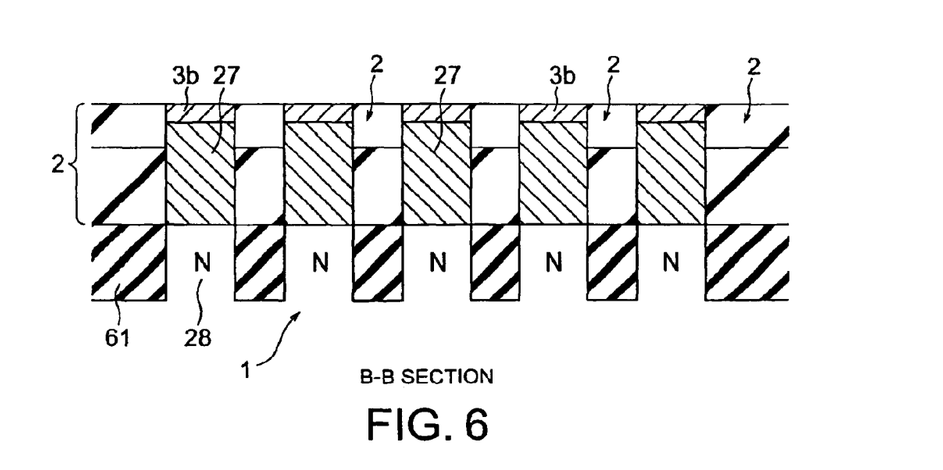
FIG. 6 is a sectional view taken on line B—B of FIG. 5.

Thereafter, a metal wiring layer having a laminated structure including a Ti layer having a thickness of 50 nm, a TiN layer having a thickness of 50 nm, and a W layer having a thickness of 250 nm is formed (the order of layers goes from lower to upper). Subsequently, the surface of the metal wiring layer is flattened to a desired height using the CMP techniques, thereby forming tungsten wiring lines 3 in the grooves (FIG. 1B). FIG. 5 is a plan view of the tungsten wiring lines 3 thus formed. FIG. 1B is a sectional view taken on line A—A of FIG. 5. FIG. 6 is a sectional view taken on line B—B of FIG. 5. As can be understood from FIG. 5, a tungsten wiring line 3 includes a contact portion 3a connecting to a metal wiring line that becomes a bit line later, and a long-and-thin portion 3b connecting to, via a bit line contact 27, an n-type active region 28 formed in the silicon semiconductor substrate 1. The tungsten wiring lines 3 having the contact portions 3a located on the lower side in FIG. 5 (the lower tungsten wiring lines) and the tungsten wiring lines 3 having the contact portions 3a located on the upper side in FIG. 5 (the upper tungsten wiring lines) are arranged in an alternating fashion. The active region 28 is isolated by a shallow element-isolation dielectric film 61 formed in the silicon substrate 1. In FIG. 6, the interlayer dielectric film 2 is composed of two interlayer dielectric films. The lower dielectric film is formed of BPSG (Boron Phosphorus Silicate Glass) in order to embed gate lines (not shown), and the upper dielectric film is formed of $SiO_2$.

Figure 1C:
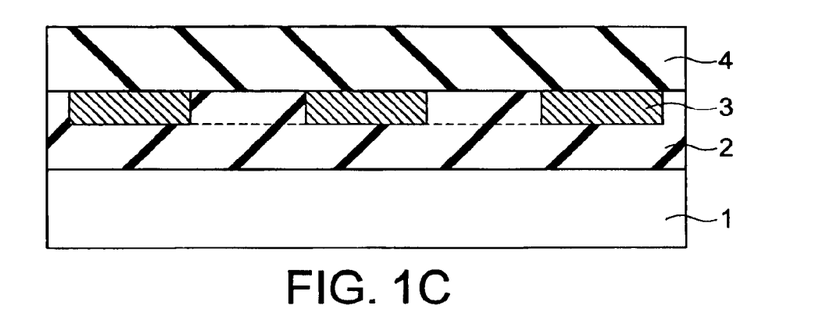
Figure 1D:
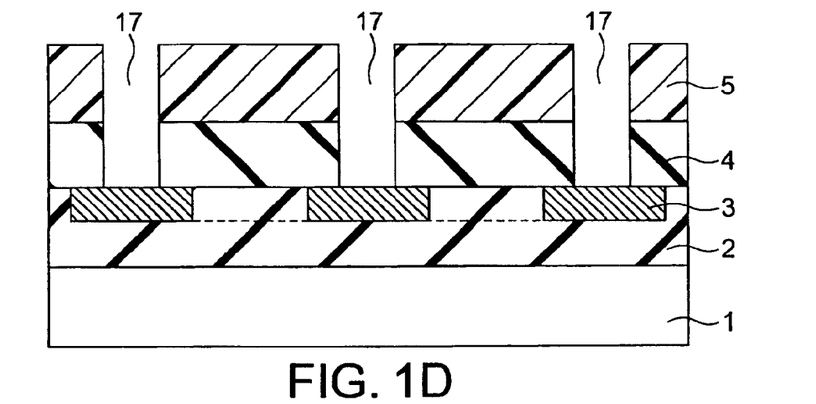

Next, an interlayer dielectric film 4 having a thickness of 500 nm is formed to cover the interlayer dielectric film 2 and the tungsten wiring lines 3 (FIG. 1C). Then, a photoresist is applied to the entire surface of the interlayer dielectric film 4, and a resist pattern 5 having openings 17 above part of every other tungsten wiring lines 3 is formed by using the photolithography technique. Subsequently, the dry etching, e.g., RIE, of the interlayer dielectric film 4 is performed using the resist pattern 5 as a mask, thereby forming via holes 17 in the interlayer dielectric film 4, the via holes having a depth of 500 nm and reaching the tungsten wiring lines 3 (FIG. 1D). Since the resist for forming via holes used in this embodiment is a thermal flow resist, the size of the openings in the resist decreases as compared with those before the exposure step.

Figure 2A:
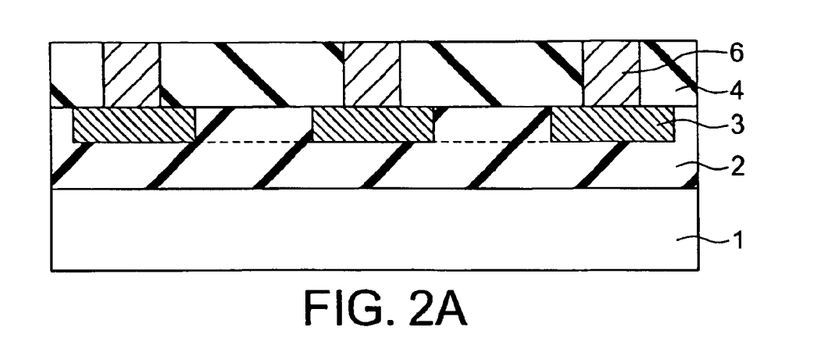
FIGS. 2A–2C are sectional views showing subsequent steps of the process of manufacturing a semiconductor memory device serving as a reference example of the embodiment of the present invention.

Then, after the resist pattern 5 is removed, a metal layer having a laminated structure including, from lower to upper, a Ti layer having a thickness of 50 nm, a TiN layer having a thickness of 50 nm, and a W layer having a thickness of 250 nm is formed so as to fill in the via holes 17. Subsequently, the surface of the metal layer is flattened to a desired height by the CMP, thereby forming tungsten plugs 6 in the via holes (FIG. 2A).

Figure 2B:
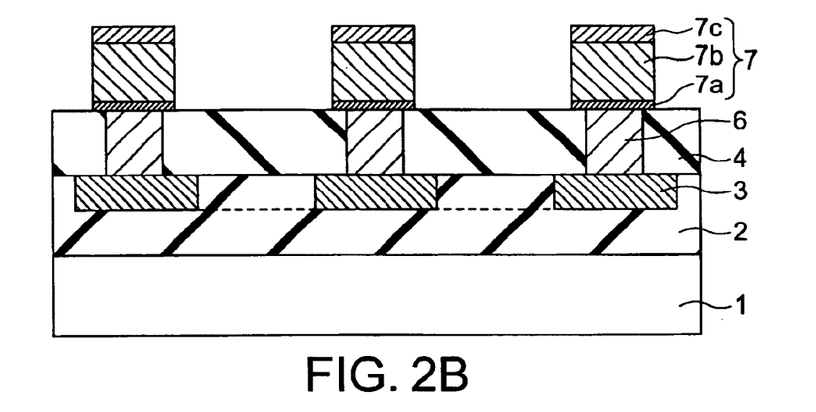

Thereafter, a metal wiring layer having a laminated structure is formed to cover the interlayer dielectric film 4 and the tungsten plugs 6, the metal wiring layer including, from a lower to a higher, a barrier metal 7a including a Ti layer having a thickness of 50 nm and a TiN layer having a thickness of 50 nm, an Al layer 7b having a thickness of 200 nm, and a barrier metal 7c including a Ti layer having a thickness of 50 nm and a TiN layer having a thickness of 50 nm. Then, a photoresist is applied to the metal wiring layer, a desired resist pattern (not shown) is formed using the photolithography techniques, and the dry etching, e.g., RIE, of the metal wiring layer is performed using the resist pattern as a mask, thereby forming metal wiring lines 7 having a thickness of 200 nm at desired positions on the tungsten plugs 6 (FIG. 2B).

Figure 2C:
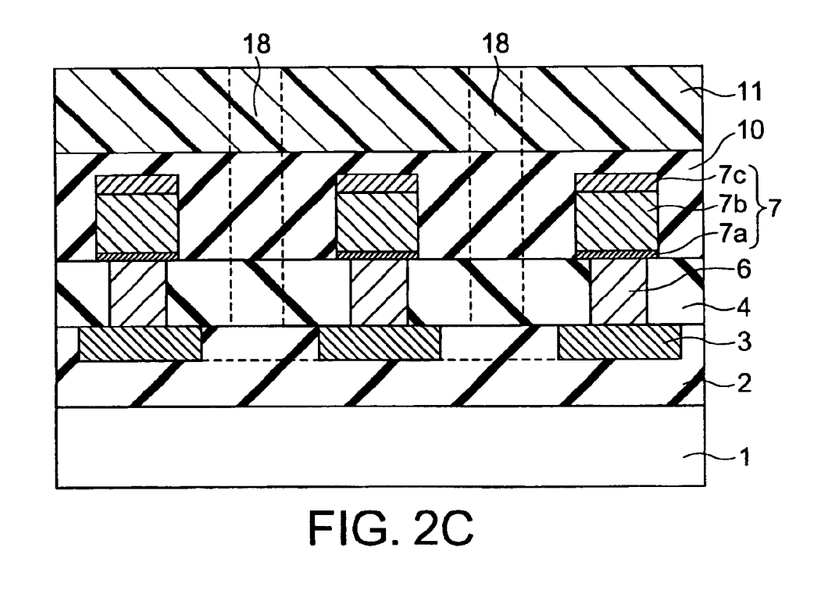

After the resist pattern is removed, an interlayer dielectric film 10 is formed so as to cover the metal wiring lines 7, as shown in FIG. 2C. Thereafter, a photoresist is applied to the entire surface of the interlayer dielectric film 10, and a desired resist pattern 11 is formed using the photolithography techniques, the resist pattern 11 having openings over the tungsten wiring lines 3 that are adjacent to the tungsten wiring lines 3 to which the tungsten plugs 6 connect. Then, the dry etching, i.e., RIE, of the interlayer dielectric films 10 and 4 is performed using the resist pattern 11 as a mask, so as to form via holes 18 through the interlayer dielectric films 10 and 4, the via holes 18 reaching the tungsten wiring lines 3 (FIG. 2C). The via holes 18 connect to the contact portions 3a of the upper tungsten wiring lines 3 in FIG. 5, which may appear when the device is sectioned along line C—C of FIG. 5. The via holes 17 shown in FIG. 1C connect to the contact portions 3a of the lower tungsten wiring lines 3 in FIG. 5. FIGS. 1A–3 are sectional views taken along line A—A of FIG. 5. As in the case of the previous step, the resist for opening via holes used in this step is a thermal flow resist. Accordingly, the size of the openings in the resist decreases as compared with those before the exposure step.

Figure 3:
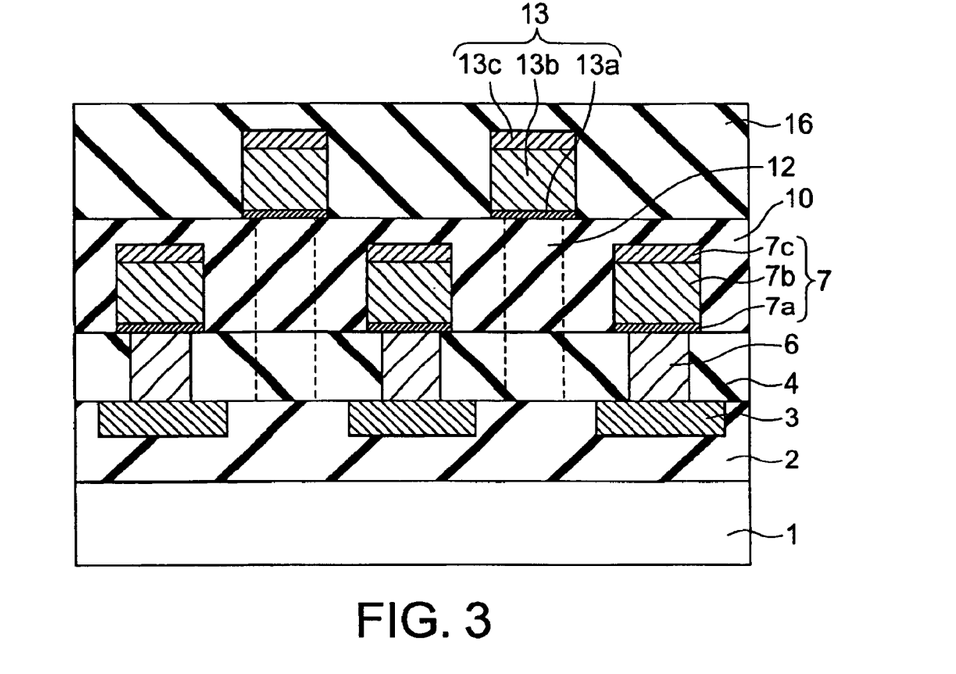
FIG. 3 is a sectional view showing the structure of a semiconductor memory device serving as a reference example of the embodiment of the present invention.

After the resist pattern 11 is removed, a metal layer having a laminated structure including, from lower to upper, a Ti layer having a thickness of 50 nm, a TiN layer having a thickness of 50 nm, and a W layer having a thickness of 250 nm is formed so as to fill in the via holes 18. Then, the surface of the metal layer is flattened by the CMP in order to form tungsten plugs 12 in the via holes 18, as shown in FIG. 3.

Subsequently, a metal wiring layer having a laminated structure is formed, which includes, from lower to upper, a barrier metal 13a including a Ti layer having a thickness of 50 nm and a TiN layer having a thickness of 50 nm, an Al layer having a thickness of 200 nm, and a barrier metal 13c including a Ti layer having a thickness of 50 nm and a TiN layer having a thickness of 50 nm. Then, a photoresist is applied to the metal wiring layer, and a desired resist pattern is formed using the photolithography techniques. Then, the dry etching, e.g., RIE, of the metal wiring layer is performed, using the resist pattern as a mask, so as to form metal wiring lines 13 to become bit lines at the desired positions on the tungsten plugs 12. After the resist pattern is removed, a protection layer 16 is formed on the metal wiring lines 13 (FIG. 3), thereby completing a part of the process of forming multi-layer wiring of the semiconductor memory device.

Figure 4:
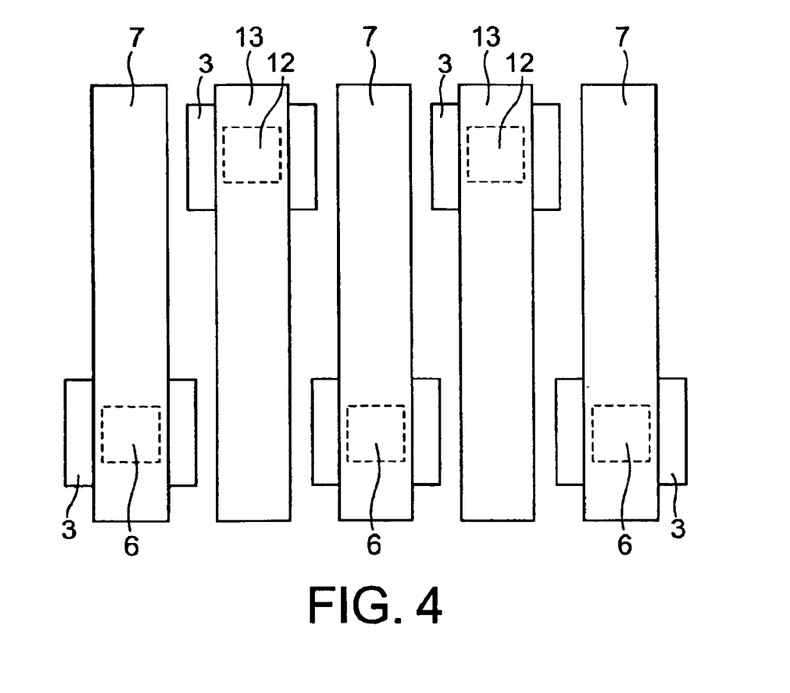
FIG. 4 is a plan view showing metal wiring of the semiconductor memory device of the reference example.

FIG. 4 is a plan view of the wiring formed in accordance with this reference example. In FIG. 4, the interlayer dielectric films 4, 10 and 16 are omitted. A semiconductor memory device in accordance with this reference example has a double metal wiring structure, which additionally includes metal wiring lines 13 as compared to a conventional semiconductor memory device. In this reference example, the thickness of and the space between adjacent metal wiring lines 7 and 13 are the same. Accordingly, the delay of a signal passing through a metal wiring line 7 and a delay of a signal passing through a metal wiring line 13 become substantially the same.

As described above, according to this reference example, the double metal wiring structure allows for an increase in space between adjacent metal wiring lines (wiring space) and in pitch of the metal wiring lines as compared to the conventional devices, resulting in that it is possible to widen the width of the metal wiring lines. Accordingly, even if the memory cells are miniaturized, it is not necessary to decrease the width of the metal wiring lines to the same degree as would be necessary with a conventional device. Thus, it is possible to prevent the decrease in reliability of metal wiring lines, and the occurrence of signal delay.

With such a bit line structure, it is possible to design a device with a less strict wiring size than that set in the design rule. Accordingly, it is possible to manufacture a memory transistor without decreasing the reliability of metal wiring and the driving force of the transistor.

Figure 7:
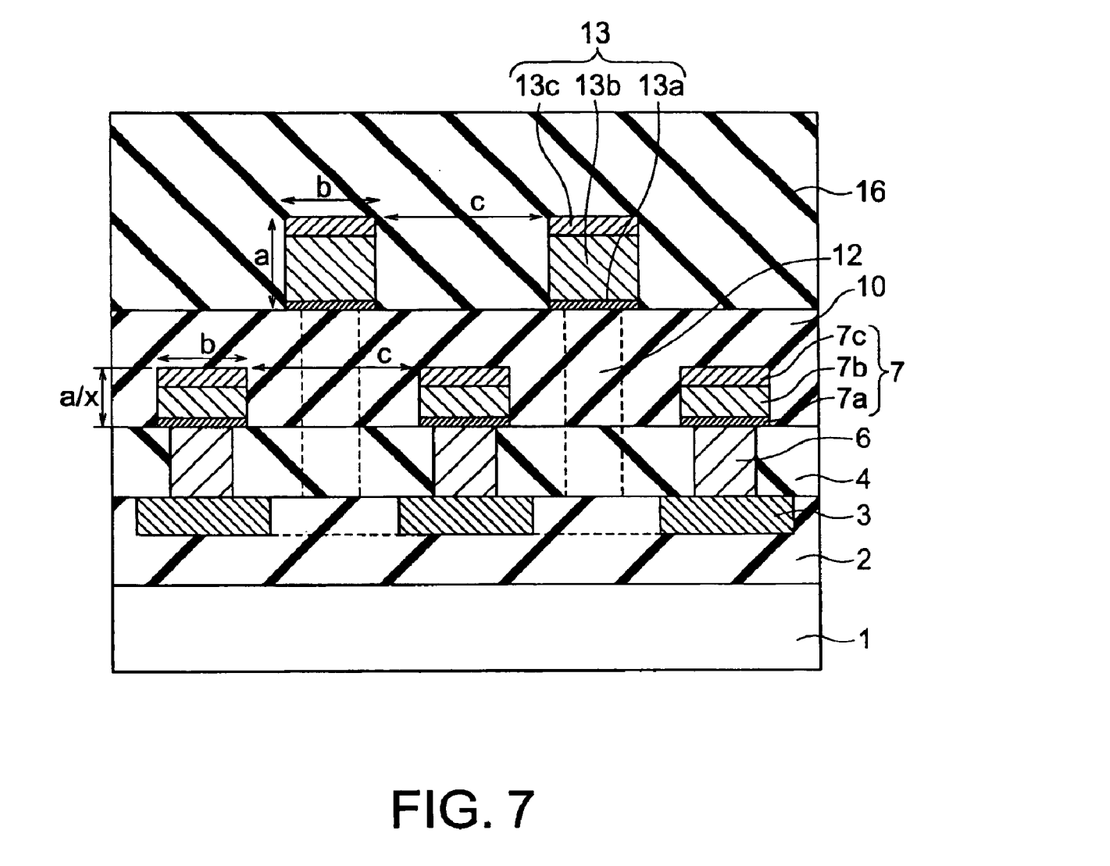
FIG. 7 is a sectional view showing the structure of a semiconductor memory device according to the embodiment of the present invention.
Figure 8:
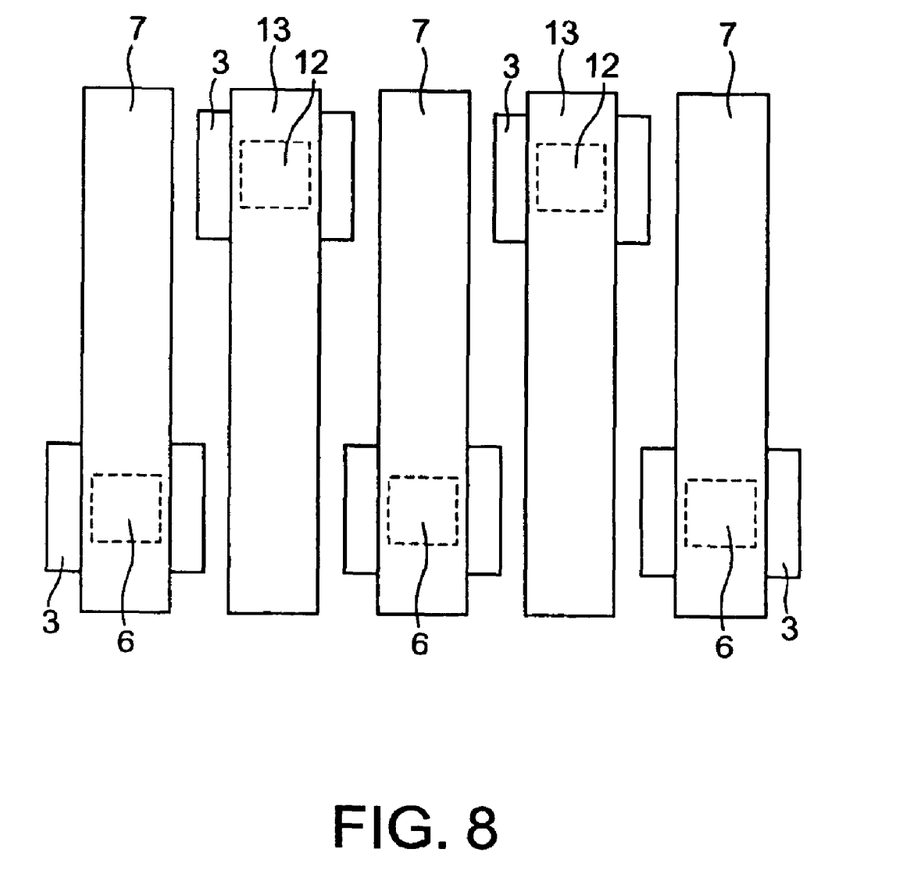
FIG. 8 is a plan view showing metal wiring of the semiconductor memory device according to the embodiment of the present invention.

Next, the structure of a semiconductor memory device according to an embodiment of the present invention will be described with reference to FIGS. 7 and 8. FIG. 7 is a sectional view showing the structure of a semiconductor memory device of this embodiment, and FIG. 8 is a plan view showing the metal wiring of the semiconductor device of this embodiment.

In the semiconductor memory device of this embodiment, the width b of the metal wiring lines 7 and 13, and the wiring space c are the same as those of the reference example. However, the thickness (layer thickness) of one of the metal wiring lines 7 and 13, e.g., the thickness of the metal wiring lines 7, is set to be $1/x$ ($x \neq 0$) times the thickness a of the other, e.g., the thickness of the metal wiring lines 13.

When the thickness of the metal wiring lines 7 is $1/x$ times the thickness a of the metal wiring lines 13, the resistance R of the metal wiring lines 7 becomes x times the resistance of the metal wiring lines 13. However, the wiring capacitance (the capacitance between adjacent wiring lines) C of the metal wiring lines 7 becomes $1/x$ times the wiring capacitance of the metal wiring lines 13. Accordingly, in this embodiment, the delay of a signal passing through a metal wiring line 7 becomes substantially the same as the delay of a signal passing through the metal wiring lines 13. In this embodiment, "substantially the same delay" means that the product of the resistance R and the wiring capacitance C for one of the metal wiring lines 7 and 13 is within the range of ±2% of that of the other.

Changing the thickness of the metal wiring lines 7 and 13 without changing the material thereof, e.g., making the metal wiring lines 13 thicker than the metal wiring lines 7, is effective when the metal wiring lines 13 are used for both the bit lines of the memory cell array and the power supply lines of the periphery circuit region. That is to say, generally, in order to achieve the miniaturization of a device, global wiring lines, such as power supply lines, are required to be located higher than local signal lines. In addition, the width of bit lines should be as narrow as possible, while the section area of power supply lines should be as large as possible in order to secure current density. Thickening the metal wiring lines 13 serving as both of these lines makes it possible to meet both of the above-described requirements. In this case, since the metal wiring lines 7 are thinner than the metal wiring lines 13, it is possible to make the interlayer dielectric film 10 thinner, thereby filling in the via holes 18 more easily when the tungsten plugs 12 are formed.

Since this embodiment has a double metal wiring structure as in the case of the reference example, it is possible to increase the space between adjacent metal wiring lines and the pitch of the metal wiring lines, this making it possible to widen the width of the metal wiring lines. Accordingly, even if the memory cells are miniaturized further, it is not necessary to decrease the size of the metal wiring lines to the same degree as would be necessary with conventional devices. Therefore, it is possible to prevent the decrease in reliability of the metal wiring lines, and the occurrence of the signal delay.

Although the thickness of one of the metal wiring lines 7 and 13 is changed without changing the material thereof in the embodiment shown in FIGS. 7 and 8, as in a modification of the embodiment the materials of the metal wiring lines can be changed so that the resistivity of one of the metal wiring lines is different from that of the other. In this case, the product of the wiring resistance R and the wiring capacitance C is adjusted to be substantially the same for both the metal wiring lines 7 and the metal wiring lines 13 by adjusting the wiring width b and the wiring space c so that the sum thereof becomes the same for both the metal wiring lines 7 and 13 and by changing the width of one of the metal wiring lines, or by using materials having different dielectric constants for the interlayer dielectric film 10 to cover the metal wiring lines 7 and the dielectric film 16 to cover the metal wiring lines 13. In particular, when the metal wiring lines 13 also serve as the power supply lines of the periphery circuit region, the use of copper, for example, is effective since its low resistivity makes the power-supply-line current density higher. In this case, if a material having a low relative dielectric constant is used as the interlayer dielectric film 10 to cover the metal wiring lines 7, it is possible to transmit signals at a high speed even if the lower layer metal wiring lines 7 are used as signal lines at the periphery circuit side.

Further, as in the case of the embodiment shown in FIGS. 7 and 8, a difference can be made between the metal wiring lines 7 and 13 with respect to the wiring width and the relative dielectric constant of the dielectric film between adjacent wiring lines, maintaining the product of the resistance R and the wiring capacitance C to be substantially the same, and using the same material for the metal wiring lines 7 and 13. That is, in a modification of the embodiment of the present invention, it is preferable that a difference is made between the metal wiring lines 7 and 13 with respect to two or three of the resistivity of the wiring material, the wiring width, and the relative dielectric constant of the dielectric film between adjacent wiring lines, so that the product of the wiring resistance R and the wiring capacitance C becomes substantially the same for the metal wiring lines 7 and 13. The thickness of the metal wiring lines 7 and 13 can be either the same or different from each other, as shown in FIG. 7.

Figure 15:
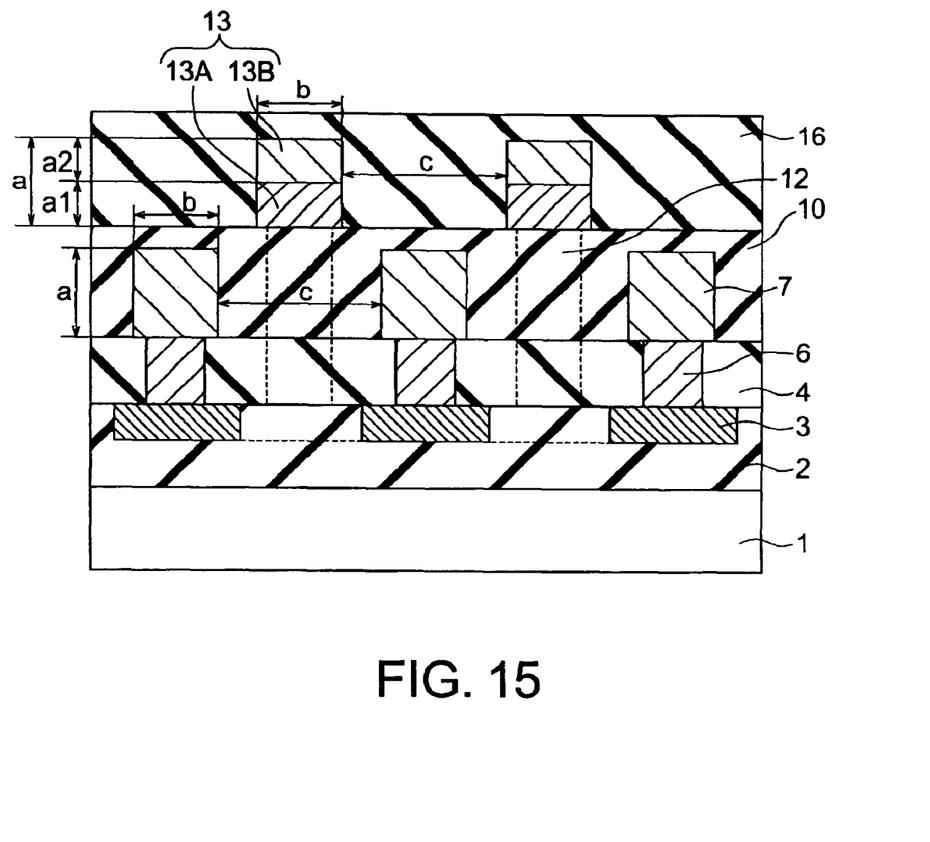
FIG. 15 is a sectional view showing the structure of a semiconductor memory device according to a modification of the embodiment of the present invention.

When different materials are used for the metal wiring lines 7 and 13, one of the metal wiring lines can have a single-layer structure while the other has a multi-layer structure (in FIG. 15, a two-layer structure). In this case, the wiring thickness a, the wiring width b, and the wiring space c can be the same for the metal wiring lines 7 and 13, but the product of the wiring resistance R and the wiring capacitance C should be substantially the same for the metal wiring lines 7 and 13. For example, in FIG. 15, assuming that the metal wiring lines 7 are formed of a single layer, the metal wiring lines 13 are formed of two layers including wiring layers 13A and 13B, the thickness of the metal wiring lines 7 is denoted by a, the width thereof is denoted by b, the resistivity thereof is denoted by $\rho$, the thickness of the wiring layer 13A is denoted by a1, the width thereof is denoted by b, the resistivity thereof is denoted by $\rho1$, the thickness of the wiring layer 13B is denoted by a2, the width thereof is denoted by b, the resistivity thereof is denoted by $\rho2$, each wiring line has the same length L, and the same material is used for both the interlayer dielectric film 10 and the protection layer 16, the resistance R of the metal wiring lines 7 can be obtained by the equation R=$\rho$×L/(b×a), the resistance R1 of the wiring layer 13A can be obtained by the equation R1=$\rho1$×L/(b×a1), and the resistance R2 of the wiring layer 13B can be obtained by the equation R2=$\rho2$×L/(b×a2). Accordingly, in the case where the resistance of the metal wiring lines 13 is adjusted to be the same as the resistance R of the metal wiring lines 7, i.e., when $$1/R = 1/R1 + 1/R2 \tag{1},$$

the product of the wiring resistance R and the wiring capacitance C is substantially the same for the metal wiring lines 7 and 13.

The thickness a of the metal wiring lines 13 is the sum of the thickness a1 of the wiring layer 13A and the thickness a2 of the wiring layer 13B. That is, $$a = a1 + a2 \tag{2}.$$

When the values of resistivity $\rho$, $\rho1$, and $\rho2$ are known, and the thickness a1 of the wiring layer 13A and the thickness a2 of the wiring layer 13B are obtained from the equations (1) and (2), the obtained values a1 and a2 provide the solution to make the product of the wiring resistance R and the wiring capacitance C be substantially the same for the metal wiring lines 7 and 13. Although the metal wiring lines 13 of FIG. 15 have a two-layer structure, they may include three or more layers.

Both of the metal wiring lines 7 and 13 may have a multi-layer structure, each being formed of different materials. Alternatively, both of the metal wiring lines 7 and 13 may have a multi-layer structure, each being formed of the same material, but each layer having a different thickness. When the multi-layer structure of the metal wiring lines 7 is different from that of the metal wiring lines 13 in such a manner that the layers of the metal wiring lines 7 are formed of materials different from those of the metal wiring lines 13, or that the layers of the metal wiring lines 7 have a constitution, e.g., thickness, different from that of the layers of the metal wiring lines 13, the combined resistance R of the metal wiring lines 7 may be different from that of the metal wiring lines 13. In that case, the material of the dielectric film to fill the spaces between the metal wiring lines 7 should be different from that to fill the spaces between the metal wiring lines 13, and/or the width of the metal wiring lines 7 and 13 should be different from each other so that the product of the wiring resistance R and the wiring capacitance C be substantially the same for the metal wiring lines 7 and 13.

Figure 14:
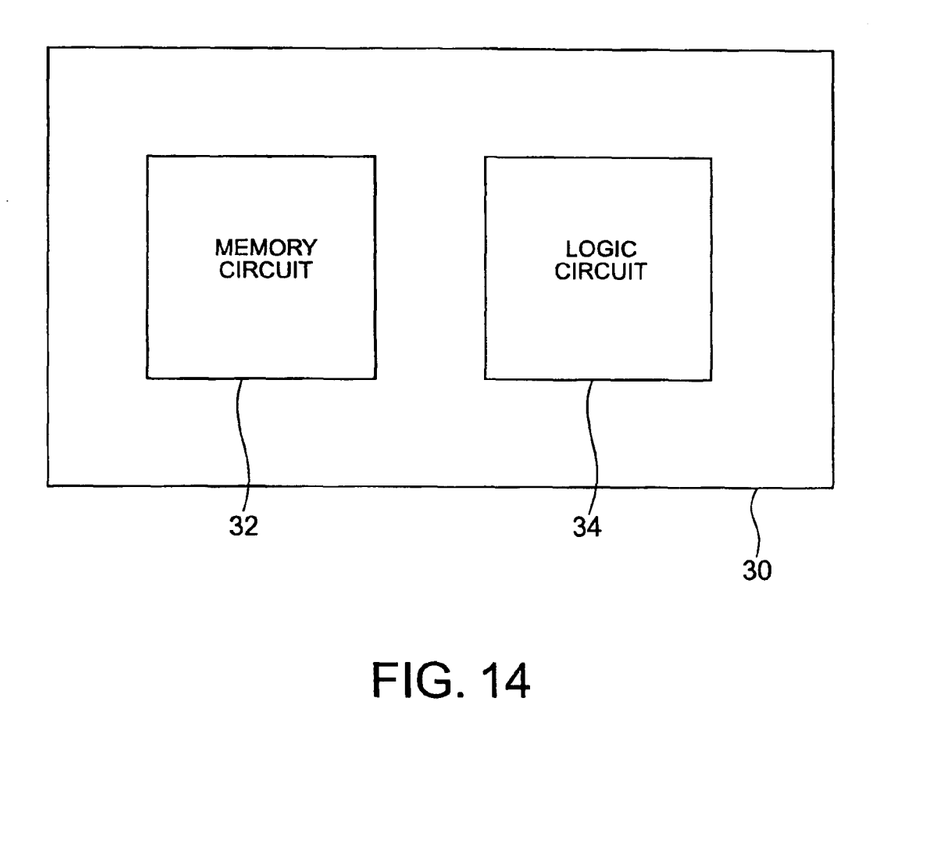
FIG. 14 is a block diagram showing the structure of a semiconductor memory device including a memory circuit and a logic circuit.

Another example of the device, in which copper is used as the material of the upper metal wiring lines 13, and a material having a higher resistivity than copper e.g. aluminum is used as the material of the lower metal wiring lines 7, is a semiconductor memory device 30 shown in FIG. 14, which includes a memory circuit 32 and a logic circuit 34 arranged on one chip. Needless to say, the present invention can be applied to such a semiconductor memory device 30.

Figure 16:
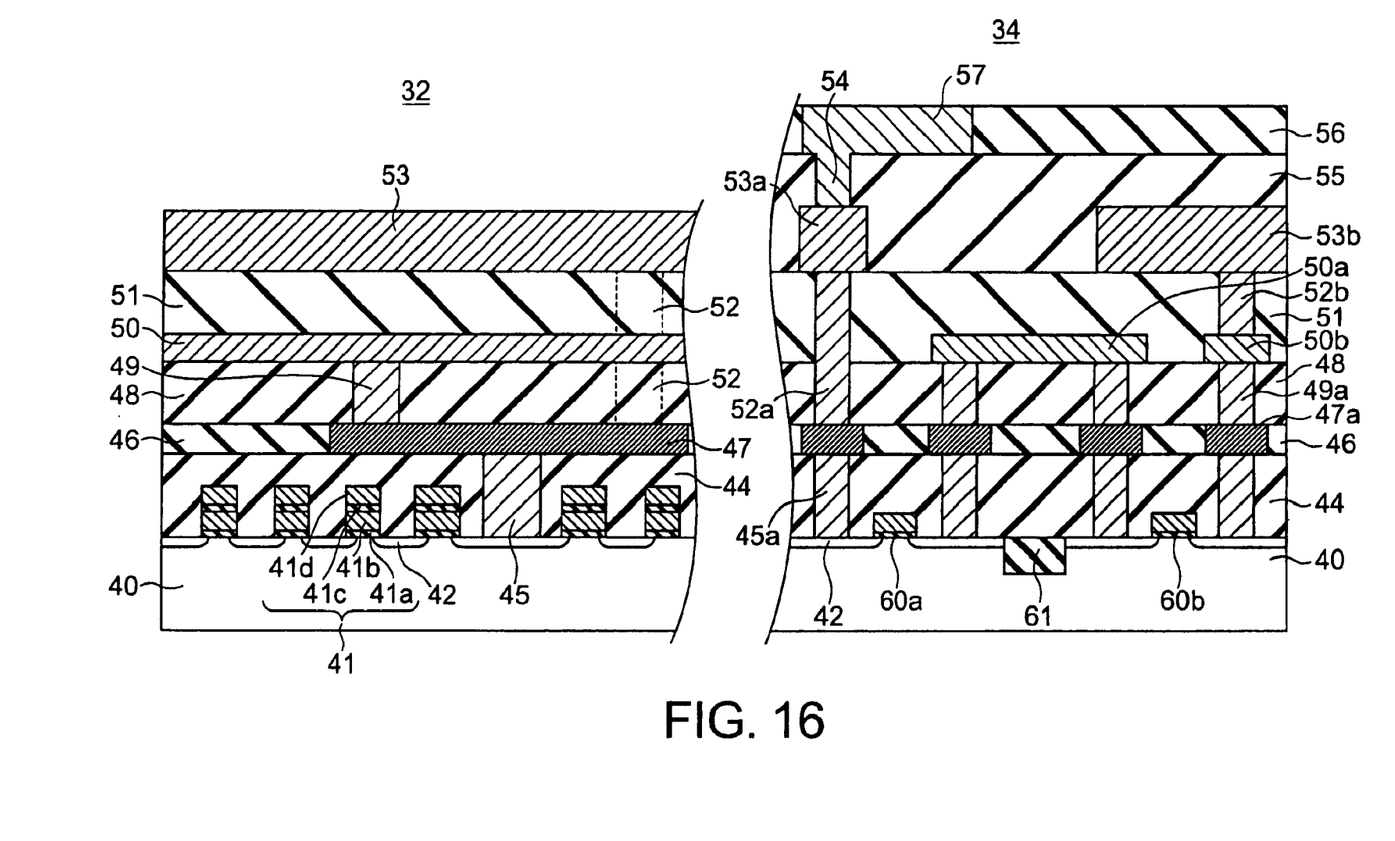
FIG. 16 is a sectional view showing an example of a semiconductor memory device including a memory circuit and a logic circuit.

A sectional view of a specific example of the semiconductor memory device 30 including the memory circuit 32 and the logical circuit 34 arranged on one chip is shown in FIG. 16. The memory circuit 32 is an EEPROM obtained by forming a NAND cell by connecting a plurality of memory cells 41, which are selected by word lines and are capable of being electrically rewritten, on a semiconductor substrate 40. Each memory cell 41 includes a floating gate 41b formed above a tunnel oxide layer 41a, an interlayer gate insulating layer 41c formed on the floating gate 41b, and a control gate 41d to serve as a word line formed on the interlayer gate insulating layer 41c. Adjacent memory cells are connected in series via a source and drain diffusion layer 42.

The NAND cell is connected to a wiring line 47 via a contact 45 formed in an interlayer dielectric film 44. The wiring line 47 is embedded in an interlayer dielectric film 46 formed on the interlayer dielectric film 44, and is connected to a first bit line 50 through a via 49 formed in an interlayer dielectric film 48 covering the wiring line 47. Another NAND cell (not shown) is connected to another wiring line (not shown) embedded in the interlayer dielectric film 46 at the same level as the wiring line 47, the other NAND cell being connected to a second bit line 53 through a via 52 indicated by broken lines, formed in the interlayer dielectric film 48 and the interlayer dielectric film 51 formed on the first bit line 51.

The logic circuit 34 includes transistors 60a and 60b serving as logic elements, arranged on the semiconductor substrate 40. Each transistor 60a or 60b is isolated by an element isolation insulating layer 61. The source and drain diffusion layer 42 of each transistor are connected to a pad 47a via a contact 45a formed through the interlayer dielectric film 44. The pad 47a is embedded in the interlayer dielectric film 46 formed on the interlayer dielectric film 44. Further, the pad 47a is either connected to wiring lines 50a and 50b located in the same layer as the first bit line 50 through a via 49a formed through the interlayer dielectric film 48, or connected to a wiring line 53a through a via 52a formed through the interlayer dielectric films 48 and 51. The wiring line 50b is connected to a wiring line 53b through a via 52b formed through the interlayer dielectric film 51. The wiring lines 53a and 53b are formed in the same layer as the second bit line 53. The wiring line 53a is connected to a wiring line 57 through a via-54 formed through the interlayer dielectric film 55 covering the wiring lines 53a and 53b. The wiring line 57 is embedded in the interlayer dielectric film 56 formed on the interlayer dielectric film 55. Such use of various wiring lines in the logic circuit 34 is for optimizing the structure of wiring pattern with respect to the area or length.

As shown in FIG. 16, generally, in a semiconductor memory device including a memory circuit 32 and a logic circuit 34, these circuits share wiring lines and interlayer dielectric films. Further, the thickness and the material of wiring, and the material of interlayer dielectric film are selected so as to optimize the wiring pattern of the logic circuit 34. Based on such conditions, in the embodiment shown in FIG. 16, the product of the wiring capacitance and the wiring resistance of the first bit lines 50 can be adjusted to be substantially the same as the product of the wiring capacitance and the wiring resistance of the second bit lines 53 by differing the width of the first bit lines 50 from that of the second bit lines 53. Although the first bit line 50 of the memory circuit 32 is at the same level as the wiring lines 50a and 50b of the logic circuit 34, and the second bit line 53 of the memory circuit 32 is at the same level as the wiring lines 53a and 53b of the logic circuit 34 in FIG. 16, these bit lines can be at the same level as other wiring lines of the logic circuit 34.

Although RIE is used to form the metal wiring lines 7 and 13 of the embodiment shown in FIGS. 7 and 8, when a material that is difficult to process by using RIE, e.g., copper, is used as the wiring material, as in the embodiment shown in FIG. 16, damascene wiring lines can be formed. In this case, it is preferable that a material having a lower dielectric constant be used for an interlayer dielectric film formed between wiring lines. Such use of a low resistance material (e.g., copper) as metal wiring lines and a low dielectric constant material as interlayer dielectric film between metal wiring lines is effective when a high-speed signal transmission is required.

Needless to say, the present invention is not limited to the aforementioned embodiments, but can be applied to various types of semiconductor memory devices such as a DRAM, a SRAM, an EPROM, an EEPROM, a ferroelectric memory, etc.

As described above, according to the embodiments of the present invention, it is possible to prevent the decrease in reliability of metal wiring lines and the occurrence of the signal delay even if memory cells are miniaturized further.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor memory device comprising:
a plurality of first connection lines arranged in parallel with each other in a same layer, each connecting to a different contact portion;
a plurality of second connection lines arranged in parallel with each other in the same layer as the first connection lines, the first connection lines and the second connection lines being arranged in an alternating fashion, and each of the second connection lines connecting to a different contact portion;
a plurality of first plugs each formed on one of the first connection lines;
a plurality of second plugs each formed on one of the second connection lines;
a plurality of first metal wiring lines connecting to the first plugs; and
a plurality of second metal wiring lines formed in a layer different from that of the first metal wiring lines, and connecting to the second plugs, the first metal wiring lines and the second metal wiring lines differing from each other with respect to at least one of thickness and width, and a product of a wiring capacitance between adjacent two of the first metal wiring lines and a wiring resistance of the first metal wiring lines being substantially the same as a product of those of the second metal wiring lines.

2. The semiconductor memory device according to claim 1, wherein the first metal wiring lines and the second metal wiring lines are formed of a same material, and constitute bit lines of a memory cell array.

3. The semiconductor memory device according to claim 2, wherein:
the layer of the first metal wiring lines are located lower than the layer of the second metal wiring lines; and
a thickness of the first metal wiring lines is thinner than a thickness of the second metal wiring lines.

4. The semiconductor memory device according to claim 3, wherein:
the layer of the second metal wiring lines constitutes a power supply line in a periphery circuit region of the memory cell array.

5. The semiconductor memory device according to claim 3, wherein a thickness of a dielectric film formed between adjacent two of the first metal wiring lines are thinner than a thickness of a dielectric film formed between adjacent two of the second metal wiring lines.

6. The semiconductor memory device according to claim 1, wherein a relative dielectric constant of a dielectric film formed between adjacent two of the first metal wiring lines is different from a relative dielectric constant of a dielectric film formed between adjacent two of the second metal wiring lines.

7. The semiconductor memory device according to claim 1, wherein either or both of the first metal wiring lines and the second metal wiring lines are damascene wiring lines.

8. The semiconductor memory device according to claim 1, wherein:
a memory circuit including a memory cell array and a logic circuit are formed on a same chip; and
the first and second metal wiring lines constitute bit lines of the memory cell array.

9. The semiconductor memory device according to claim 8, wherein the first and second metal wiring lines further constitute a wiring pattern of the logic circuit.

10. A semiconductor memory device comprising:
a plurality of first connection lines arranged in parallel with each other in a same layer, each connecting to a different contact portion;
a plurality of second connection lines arranged in parallel with each other in the same layer as the first connection lines, the first connection lines and the second connection lines being arranged in an alternating fashion, and each of the second connection lines connecting to a different contact portion;
a plurality of first plugs each formed on one of the first connection lines;
a plurality of second plugs each formed on one of the second connection lines;
a plurality of first metal wiring lines connecting to the first plugs; and
a plurality of second metal wiring lines formed in a layer different from that of the first metal wiring lines, and connecting to the second plugs,
the first metal wiring lines and the second metal wiring lines differing from each other with respect to at least one of material and constitution, and a product of a wiring capacitance between adjacent two of the first metal wiring lines and a wiring resistance of the first metal wiring lines being substantially the same as a product of those of the second metal wiring lines.

11. The semiconductor memory device according to claim 10, wherein the first metal wiring lines and the second metal wiring lines constitute bit lines of a memory cell array.

12. The semiconductor memory device according to claim 10, wherein a relative dielectric constant of a dielectric film formed between adjacent two of the first metal wiring lines is different from a relative dielectric constant of a dielectric film formed between adjacent two of the second metal wiring lines.

13. The semiconductor memory device according to claim 10, wherein either or both of the first metal wiring lines and the second metal wiring lines are damascene wiring lines.

14. The semiconductor memory device according to claim 10, wherein either or both of the first metal wiring lines and the second metal wiring lines have a multi-layer structure obtained by laminating layers of different materials.

15. The semiconductor memory device according to claim 14, wherein:
the first metal wiring lines and the second metal wiring lines have a same width and a same thickness.

16. The semiconductor memory device according to claim 10, wherein:
the layer of the first metal wiring lines are located lower than the layer of the second metal wiring lines;
the material of the second metal wiring lines has a lower resistivity than the material of the first metal wiring lines; and
a relative dielectric constant of a dielectric film formed between adjacent two of the first metal wiring lines is lower than a relative dielectric constant of a dielectric film formed between adjacent two of the second metal wiring lines.

17. The semiconductor memory device according to claim 11, wherein:
the layer of the first metal wiring lines are located lower than the layer of the second metal wiring lines;
the layer of the second metal wiring lines constitutes a power supply line in a periphery circuit region of the memory cell array; and
the layer of the first metal wiring lines constitutes a signal line in the periphery circuit region.

18. The semiconductor memory device according to claim 10, wherein:
a memory circuit including a memory cell array and a logic circuit are formed on a same chip; and
the first and second metal wiring lines constitute bit lines of the memory cell array.

19. The semiconductor memory device according to claim 18, wherein the first and second metal wiring lines further constitute a wiring pattern of the logic circuit.

20. The semiconductor memory device according to claim 19, wherein:
the layer of the first metal wiring lines are located lower than the layer of the second metal wiring lines;
the first metal wiring lines are formed of aluminum; and
the second metal wiring lines are formed of copper.

* * * * *